MODULAR CIRCUITRY

Original Filed Nov. 21, 1955 3 Sheets-Sheet 1

INVENTOR.
CLAUDIUS T. McCOY
BY
Carl H. Synnestvedt
AGENT

MODULAR CIRCUITRY

Original Filed Nov. 21, 1955 3 Sheets-Sheet 2

INVENTOR.
CLAUDIUS T. McCOY
BY
Carl H. Lynnestveit
AGENT

MODULAR CIRCUITRY

Original Filed Nov. 21, 1955 3 Sheets-Sheet 3

INVENTOR.
CLAUDIUS T. McCOY
BY
Carl H. Synnestvedt
AGENT

United States Patent Office

Re. 25,317
Reissued Jan. 8, 1963

25,317
MODULAR CIRCUITRY

Claudius T. McCoy, Upper Darby, Pa., assignor to Philco Corporation, Philadelphia, Pa., a corporation of Delaware Original No. 2,894,077, dated July 7, 1959, Ser. No. 548,103, Nov. 21, 1955. Application for reissue June 28, 1961, Ser. No. 124,278
13 Claims. (Cl. 330—66)

Matter enclosed in heavy brackets [ ] appears in the original patent but forms no part of this reissue specification; matter printed in italics indicates the additions made by reissue.

This invention relates to articles and systems embodying modular circuitry. The articles will be called electric circuit modules; they are in the nature of component assemblies wherein elements of an electric circuit are provided, supported, spaced and interconnected in fixed, three-dimensional arrangements. The more comprehensive systems or apparatus according to the invention incorporate such modules as principal parts thereof.

The arrangements referred to have some similarity with those of modules known in the building art. It is a basic object of building modules, and likewise an object of the electric circuit modules, to insure uniformity in, and compactness of, a comprehensive system or circuit or combination of modules. In the present art such a combination may provide an energy transmission system, for instance, an intermediate frequency amplifier. The component modules of the system, or most of them, are desirably interchangeable with one another.

Another basic object of the present electric circuit module is to insure precise circuit operation. This is achieved, in part by certain features of arrangement of modular and other circuit elements, such as interconnecting conductors, and in other part by certain features of form of modular circuit elements, such as shields between successive circuit portions.

Still another basic object is to facilitate assembly, disassembly and service. This is also achieved by special features of the present modules, relating in part to certain circuit and conductor elements and arrangements thereof, and in other part to further characteristics, making the modules freely interchangeable. In effect, the modules according to this invention constitute plug-in panels with particular circuitry thereon; provision being made for forming and compressing a stack of plugged-in modules.

Heretofore circuit elements of electric apparatus, such as radio receivers, often were supported and spaced in a fixed, two-dimensional arrangement, on a flat chassis suitably punched and prepared for such purposes; sometimes with so-called printed circuits on one or both panel surfaces. Such two-dimensional chassis arrangements have often become too large, mechanically unwieldly, inefficient and uneconomical; mainly when apparatus of high electronic complexity was involved. For this reason three-dimensional or modular component arrangements are now resorted to. However, the modules known and used up to now had difficult problems of their own.

The most successful earlier modules consists in stacks of insulator wafers lined up on riser wires; each wafer usually having a circuit element such as a coil, capacitor or resistor or sometimes a tube or the like attached thereto. Terminals of the wafer, usually in marginal positions, establish contact between various terminals of the circuit elements and corresponding riser wires. In such apparatus, stray coupling tends to occur between riser wires and elsewhere, profoundly affecting attainable characteristics as to gain, bandwidth, stability, etc. In addition, tuning alignment of such apparatus is difficult; amplifier parts are not freely interchangeable; and other limitations or shortcomings exist. Other types of modules are known, and they also have various combinations of problems, similar to those mentioned.

It is an important object of this invention to overcome the limitations and shortcomings of prior electronic modules, as well as the problems of still earlier chassis structures and the like.

A more specific object is to provide modules and combinations thereof which can yield a greater product of gain and bandwidth than prior apparatus could yield.

A related object is to provide modules and combinations thereof which perform with high precision and stability, unaffected by heat variations, mechanical vibrations, contact corrosion and the like.

Another object is to form a module combination or apparatus which is small, cheap, simple to build and simple to service even if the complete circuit incorporated therein is highly complex.

An object related with the last-mentioned one is to simplify production (including automatic production), alignment, insertion and interchange of modules.

Still other objects will appear from the detailed description to be given hereinafter.

The objects have been achieved by the present module units and combinations, a brief description of which is as follows:

According to one aspect of the invention, there are provided module panels or boards which are stacked and direct-coupled by power leads only; it being preferred to filter substantially all RF energy from such leads. Substantially purely inductive intermodular coupling is employed for the RF energy.

According to another aspect of the invention there is provided a module or circuit panel constituting what will be called a self-shielded modular stage of circuit elements. This modular stage comprises a group of module input circuit elements, a group of module output circuit elements, a tube or other electron device associated with these groups by suitable conductors, and a simple but effective shield isolating the two groups of circuit elements from one another. It is preferred to form the shield as a conductive surface coating on a panel of insulating material; the panel being used also to support the circuit elements and electron device. It is further preferred to utilize the shield also as a ground connector for various circuit elements and for the electron device. Still further the shield is desirably utilized as a conductor of heat.

Still other aspects of the invention will appear hereinafter, relating for instance to special forms of inductive coupling means; special arrangements of the complete modular stage; special forms of conductors used in the modular stage; special filters; and other particular features.

These objects, aspects, features and advantages of the invention will be understood more clearly upon a study of the following detailed description of preferred embodiments wherein—

Figure 1:
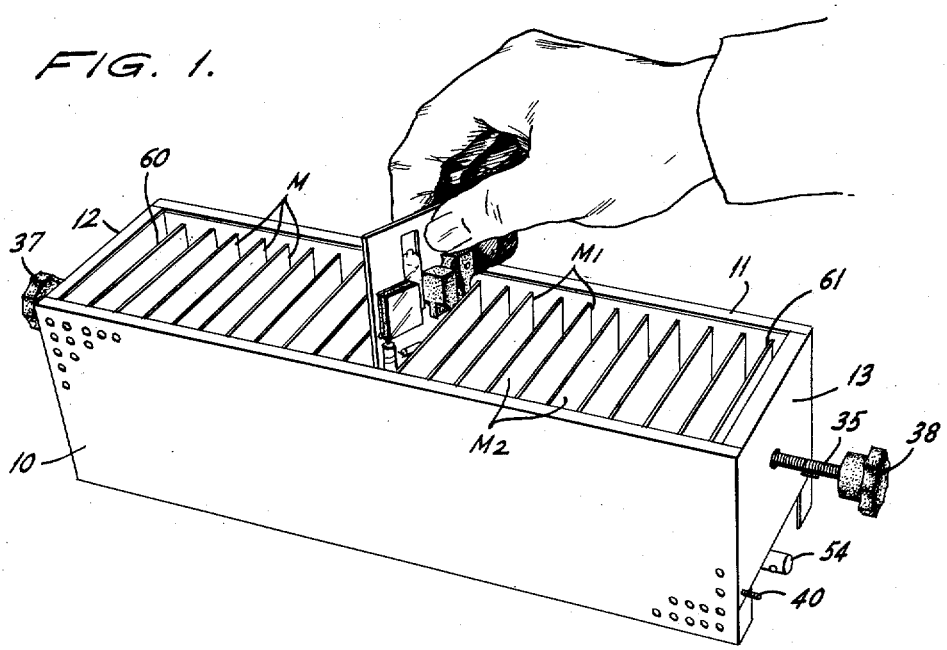
FIG. 1 is a perspective view of an amplifier incorporating this invention.

Referring first to FIG. 1, the invention is shown as incorporated in an amplifier comprising a stack of circuit modules M. Each of these modules comprises an assembly of circuit elements distributed in a substantially block-shaped portion of space and firmly secured together. The stack of modules has a box-like enclosure, formed by a pair of side walls 10, 11, a pair of end walls 12, 13, and (FIG. 6) bottom and top walls 14, 15. Such walls may be panel-perforated, as suggested by the representation of corners of side wall 10 in FIG. 1; this will reduce their weight and will also aid in dissipating heat which is generated in the operation of the apparatus.

Figure 3:
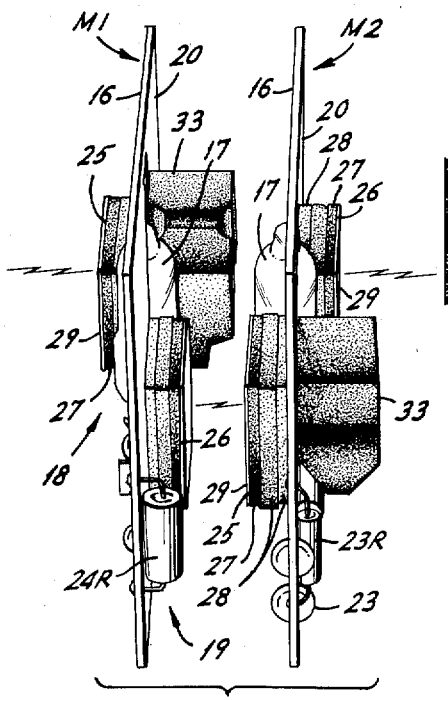
FIG. 3 is a more complete and detailed and similarly exploded and perspective view of two such modules.
Figure 2:
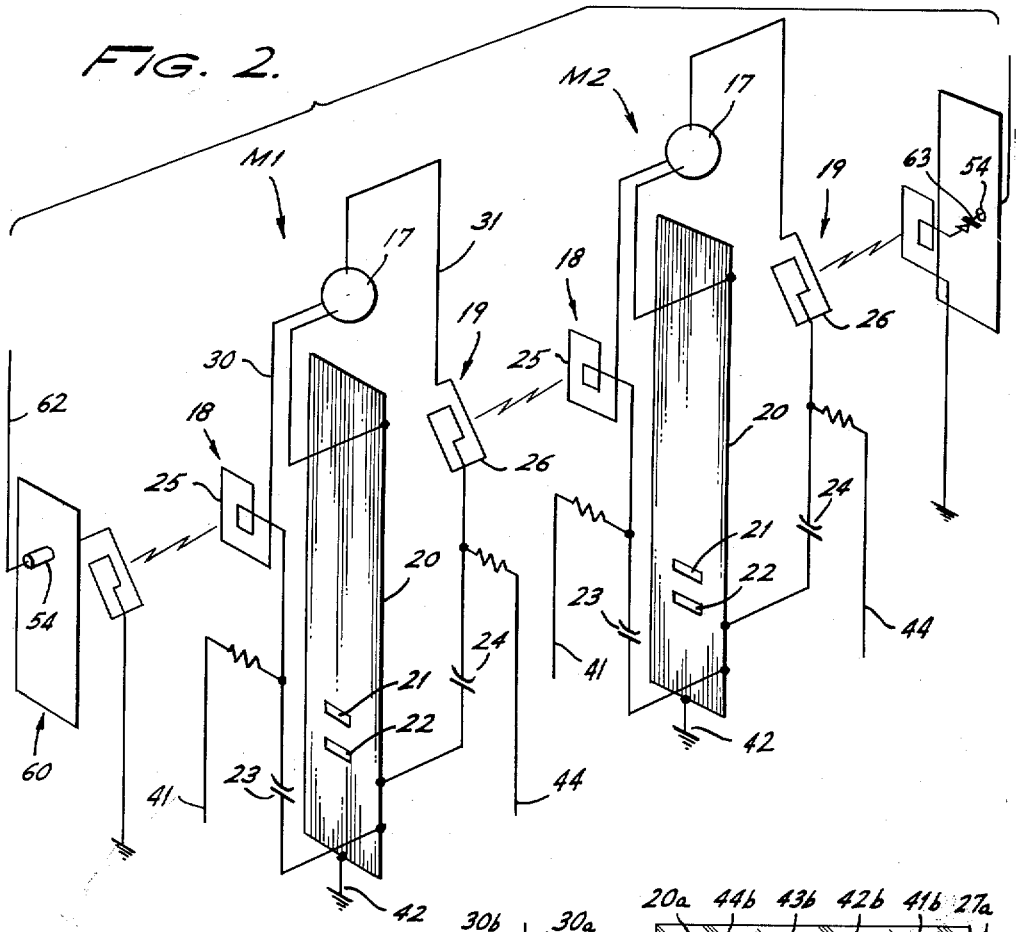
FIG. 2 is an exploded, perspective, fragmentary, diagrammatic view of certain modules forming part of the amplifier.

In FIGS. 2 and 3 there are shown two modules M1, M2, arbitrarily chosen from some portion of the stack between the ends thereof. They are susbstantially identical; but, as may be noted from FIG. 3, module M2 is formed as a mirror image of module M1. Particularly, what in FIG. 3 appears as the right-hand side of module M2 is originally formed as a mirror image of what here appears as the right-hand side of the other module M1; the modules then being turned side-for-side to establish their positions, as shown in FIG. 3. The mutual relationship is similar between the forms of the left-hand sides of the modules illustrated in FIG. 3.

Each module—M1 as well as M2—comprises an approximately square, flat, carrier card, board or panel 16, desirably of synthetic, mechanically stable, electrically insulating plastic of predetermined dielectric strength, such as the tetrafluoroethylene polymer made by E. I. du Pont de Nemours & Co., known as Teflon. Mounted upon each carrier panel 16 are a number of components or elements, comprising particularly: an electron device 17, for instance, an electronic tube or transistor; a group of input circuit means for the electron device, generally identified by numeral 18; a group of output circuit means for the electron device, generally identified by 19; and, as best shown in FIG. 2, a large metallic shield 20, isolating at least some of the input circuit means 18 from at least some of the output circuit means 19. This shield 20, as well as a number of other circuit means on the module panel, may be formed as a so-called "printed circuit" element. This in turn may be done for instance by electrolytically or otherwise depositing, on one side of the carrier board, a layer of metal, such as copper, and by etching small, required apertures or cut-outs 21, 22 into the layer. Some such cut-outs may extend through the entire board 16. They serve for instance to allow insertion, in a plane transverse of the board 16 and shield 20, of certain capacitors such as those shown at 23, 24, which form parts of circuits 18, 19, as will be explained in greater detail hereinafter.

Each input circuit group 18 comprises a coil or spiral inductor element 25, in front of the shield 20, and each output circuit group 19 comprises a generally similar element 26, in back of the shield. Desirably the coils 25, 26 may be formed as printed circuit elements on said flat sub-carrier boards 27, parallel to shield 20, as best shown in FIG. 3. One or several pads 28 may be interposed between each main board 16 and coil-bearing board 27, in order to avoid the necessity of printing circuitry on relatively heavy blocks and yet to allow proper coil spacing. Such spacing is further controlled by protective and insulating films 29, attached to the surfaces of coil-carrying sub-carriers 27. At least one such film 29 spaces the output coil 26 of any one module M1 from the input coil 25 of the next succeeding module M2, see FIG. 6. Said Teflon or various other materials can be used for making the pads and films 27, 28, 29. The thickness and dielectric strength of the films 29, in contact with one another, determine the degree of coupling between the modules.

Figure 10:
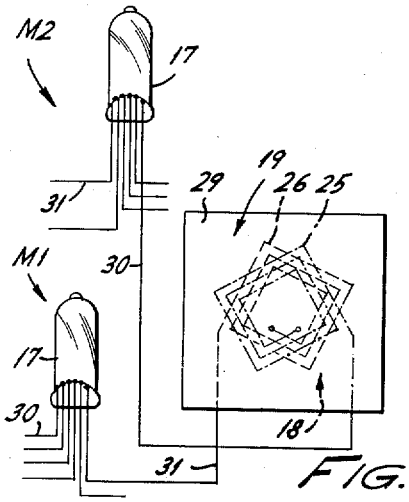
FIG. 10 is a fragmentary, diagrammatic front view of two of the modules, in line with one another.

As best shown in FIG. 10, the flat printed coils 25, 26 of successive modules desirably have the form of rectangular and, specifically, square spirals, angularly displaced relative to one another and inscribed in areas superimposed on one another. Such areas, as shown in FIG. 2, are superimposed on inner portions of the areas of the much larger shields 20. By these arrangements the inductive coupling between adjacent modules can be predetermined with great accuracy. Capactive coupling between adjacent coils 26, 25 is minimized by the angular displacement between the coils. Inductive as well as capacitive coupling, feedback and other stray influence from any one coil or circuit element to a preceding coil or set of elements or module is minimized by a shield or shields 20. At the same time, the physical spacings between all input and output coils 25, 26 can be very short; the overall thickness of a module depends only on the size of the components forming part thereof. Thus the stack can be very compact. This again leads to the desirable feature that the shielding effect, mentioned above, can be obtained without any benefit of outer shielding. However, in order to minimize the areas of shields 20 and modules M and the size of the entire stack, it may be preferred to form for instance the side walls 10, 11 and/or top and bottom walls 14, 15 (FIGS. 1 and 6) in form of metallic shields.

Danger of stray coupling exists also wherever mere conductors of appreciable length, or of appreciable length and capacity, extend in proximity to one another, mainly if they carry signals of intermediate or high frequencies. For this reason the conductor 30 leading from input coil 25 to electron device 17, and the conductor 31 leading from that device to output coil 26 are arranged in particular manner, best shown in FIGS. 4 and 5. (The schematic FIGS. 2 and 10 are distorted in this respect, in the interest of disclosing other features.) From FIGS. 4 and 5 it may be noted that the conductors 30, 31 of each module, leading from the respective coils 25, 26 to opposite ends of the base or socket portion 32 of the electron device 17, are made very short, whereby they are practically free from anything which might cause stray coupling between these conductors. Said conductors are only a few times longer than wide. In a typical application this feature has reduced the parasitic capacity of the network of connectors on a module from about nine to about three micro-micro-farads.

The specific electron device 17 is shown as a subminiature pentode of known type, wherein the various connectors are aligned side by side, the input and output connectors, corresponding with the conductors 30, 31, being disposed at opposite ends of a flat base portion 32. In connection with such a tube it has been found most efficient to arrange the flat base portion 32 in a plane parallel with that of the module panel and to arrange the coils 25, 26 of the module on both sides of the tube, with the conductors 30, 31 leading from the two opposite ends of the base 32 to corresponding, adjacent, lower corners of the coil assemblies. Accordingly, the coils and coil supporting sub-carriers and pads 27, 28 (see FIG. 3), forming part of each module, are not only disposed in planes separated by the shield 20 but also on axes separated by the electron device or tube 17.

Figure 6:
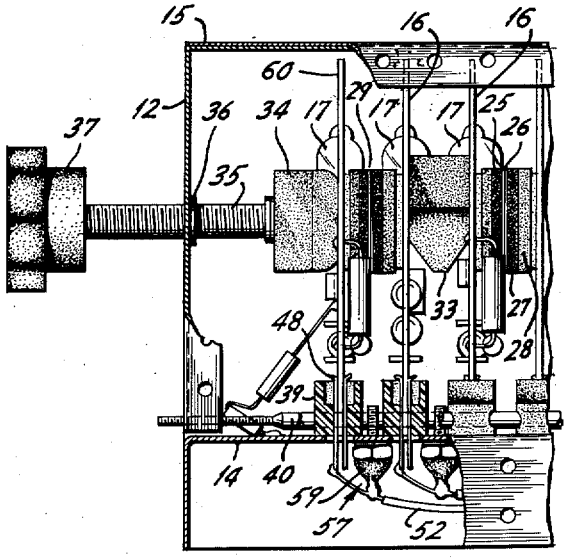
FIG. 6 is a side view, partly broken away, of one end of the apparatus of FIG. 1.

In order to keep the modules M in parallel planes, while allowing application of axial, endwise pressure to the stack of modules, for proper and uniform coil spacing, a spacer 33 is attached to each panel 16 in a suitable location. As shown, this spacer is attached on that side of the panel which also carries the shield 20 and the output coil and coil supports 26, 27, 28, 29; the spacer being disposed approximately at and around the center line of the input coil 25 of the module. Thus the panels can be held in the stack in closely packed manner, as shown in FIGS. 1 and 6. The showing of FIG. 3, wherein the successive panels M1, M2 and their components are widely spaced from one another, is schematic in this respect, and is intended only to disclose other features of module arrangement.

The axial endwise pressure which has just been mentioned is applied to the stack of modules by a pair of end compressor members 34 (FIG. 6), which can be suitably spaced from the centers of corresponding end walls 12, 13 by screw-press means 35, threaded into such walls at 36 and rotatable by outer knobs 37, 38. Firm manual tightening of the tack, by suitable rotation of the knobs 37, 38, secures the modules against slippage or other disturbance in case of vibration or the like, and such manual tightening is also sufficient in order to make sure that the spacing of coupled coils 25, 26, occurs properly across corresponding insulator spacers 29. The compression of the stack can be maintained, and loosening of the press screws 35 prevented, by some slight spring action in the end walls 12, 13.

Figure 5:
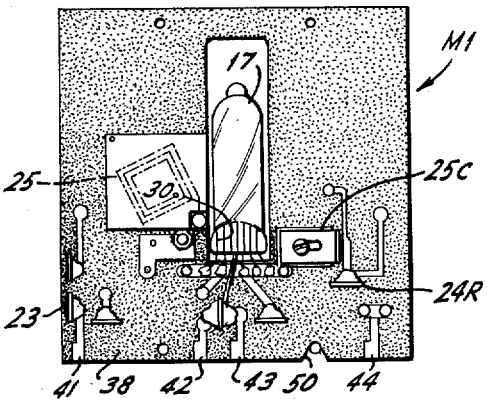
Figure 9:
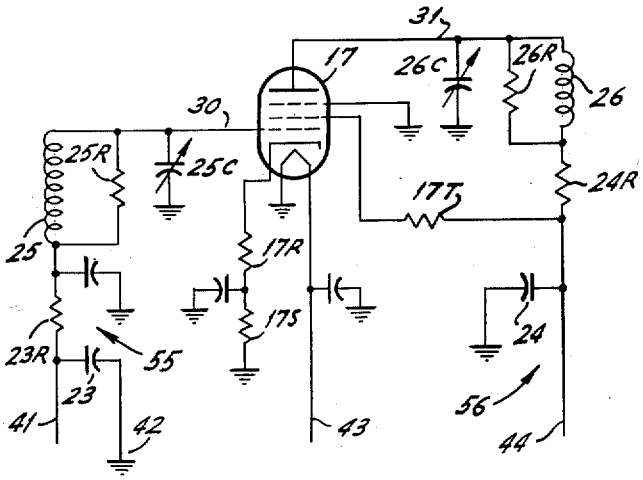
FIG. 9 is a conventional schematic diagram of the circuit elements mounted on one of the modules.

A number of electric connections are required for each module, as is clear even from the simplified, diagrammatic showing in FIG. 2. A preferred form of such connections is best shown in FIG. 5. It will be noted that a lower edge portion 38 of the module, on the side of carrier board 16 not covered by shield 20, is arranged for connection with a conventional elongated socket member 39, shown in FIGS. 6 and 7. A series of the socket members 39, parallel with one another, are secured to the inside of the box-shaped amplifier apparatus, adjacent and above the bottom plate 14, by a pair of guide and holder bars 40 engaging the ends of the members 39. Each module has four terminals, as shown in FIGS. 5 and 9, identified respectively by numbers 41, 42, 43 and 44. These terminals lead to sources of power supply and ground connection, through the sockets 39. A particular function of the shield 20, on one side of the carrier board 16, is to provide the grounding means for the various circuit elements of the module, all of which it connects to the ground terminal 42.

Figure 4:
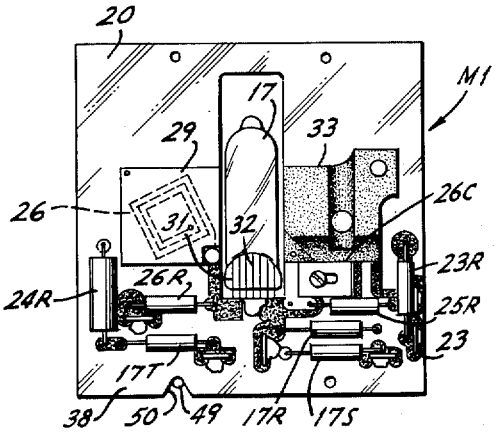
FIGS. 4 and 5 are respectively back and front views of one of the modules.

These various circuit elements of the complete modular stage or interstage are best shown in FIG. 9. They comprise the pentode 17, or any other electron device having at least an input electrode, an output electrode and a third electrode common to the input and output electrodes. As to the network supplementing the electron device and mounted on the module, the present modular stage differs from a conventional amplifier stage. A conventional stage includes a tube, or equivalent thereof, and the associated network from grid to grid. The present modular stage, by contrast, includes a tube, or equivalent thereof, and associated circuit groups from input coil to output coil of the said stage. In the specific embodiment shown, the input coil 25, by the short conductor 30, is connected with the control grid of the pentode 17, the plate of which is connected by the short conductor 31 with the output coil 26. The input and output coils 25 form parts, respectively, of conventional resonant grid and plate circuits, comprising grid circuit resistor 25R, grid circuit capacitor 25C, plate circuit resistor 26R and plate circuit capacitor 26C. The capacitors 25C and 26C are adjustable trimmers and are desirably disposed on opposite sides of shield 20 and in planes parallel therewith (FIGS. 4 and 5). The network also comprises a cathode ground circuit containing resistors 17R, 17S and a by-pass capacitor. A filament circuit is connected to power and ground by terminals 43 and 42, respectively. The screen grid of the pentode is connected with the power supply 44 through a resistor 17T. Power lead filtering is provided in forms to be described hereinafter. The suppressor grid and one side of each capacitor are grounded.

As diagrammatically indicated in FIG. 2, all grounding of various circuit elements of modules M1, M2 is done through the shield 20. This shield provides ample metal for the purpose of convergently carrying energy to the ground from all points distributed over the area of the module. In FIG. 9, the shield has been omitted in the interest of simplicity of schematic illustration. However it will be understood that all ground points shown in the figure can be connected with such a shield and that the shield isolates one group of circuit elements, including input coil and conductors 25, 30, from another group, including output coil and conductor 26, 31. The shield substantially avoids all undesirable circulation of ground currents as well as feedback currents.

No attempt is made to isolate all capacitors of the input and output circuits 18, 19 from one another by the shield 20. On the contrary, a number of fixed capacitors 23, 24, etc. are intalled transversely of the shield, as clearly shown in FIGS. 3 to 6. By virtue of the direct connections which are possible as a result of this expedient, the predetermined capacity value of fixed and mass produced capacitors can be utilized in the quantitative layout of the circuit, without special consideration as to distributed capacity and inductance occasioned by physical variation in lead length, etc. Such transverse installation of capacitors becomes possible and simple by providing the aforementioned cut-outs 21, 22 in the shield and panel and by additionally providing a set of small, simple, fixed capacitors. Such capacitors can have the form of "disc cap" capacitors, without their leads and encapsulations. The resulting circular sandwich structures, composed of special insulator material and conductive metal layers or coatings thereon, are half-way inserted in suitable slots 21, 22, etc. in the panel 16, so that uniform segments of each wafer project on both sides of the panel. Required solder connections can then be made in known manner, as clearly shown in FIGS. 4 and 5.

Figure 7:
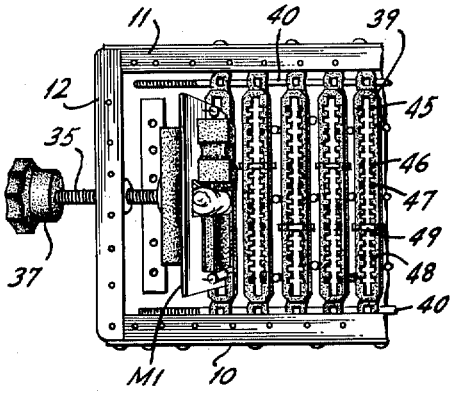
FIGS. 7 and 8 are respectively top and bottom views of said end of the apparatus.
Figure 8:
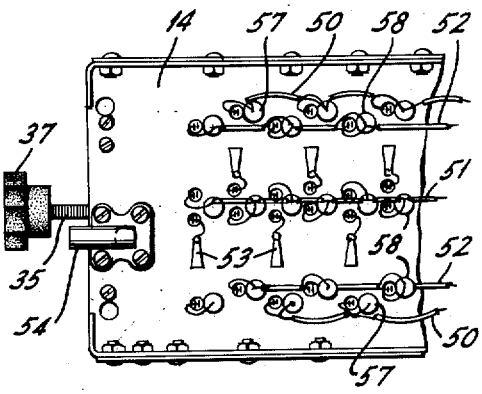

The apparatus also comprises (FIGS. 7 and 8) circuit means associated with the connector sockets 39 at the bottom of the stack of modules. Each socket 39 for a module M1 comprises a set of pairs of spring clips or equivalent connectors 45, 46, 47, 48, suitably spaced to match, respectively, the position of the module terminals 41, 42, 43, 44 (FIG. 5). In addition, each socket 39 (FIG. 7) has a pin 49 located at a point suitably spaced from the longitudinal center line of the stack and matching (FIG. 4) a notch 50 in the bottom edge 38 of the module M1. Each socket for a mirror image module M2 has a corresponding set of connector clips and pins, symmetrically transposed about said center line (FIG. 7). Each pair of connector clips (FIG. 6) ends in a pair of wires extending downwards through a suitable aperture in the bottom plate 14. Below that plate (FIGS. 6, 8) the wires connected to the power lead terminals 41, 43, 44, are connected with power lead bus bars 50, 51, 52, respectively, whereas the wires from the ground terminals 42 are connected with adjacent lugs or clips 53 struck out of the bottom plate 14 along the longitudinal center line of said bottom plate. In order to facilitate wiring of mirror image modules M2 as well as ordinary modules M1, each bus bar 50, 51, 52 as well as the row of ground clips 53 extends along the stack of modules in form of a loop having two consecutive sections (FIG. 8); the bus bars being interconnected by suitable conductors, not shown, at the right-hand end of the stack.

In addition to these leads, input and output fixtures 54 of known type may be attached to the bottom plate 14, desirably applying heavy shielding to the input and output wires.

The power leads are kept free of RF energy by the combined effects of two filter systems. A first system is substantially formed by input and output power filter means of the by-pass capacitor type for and on each module; these filter means being generally shown at 55 and 56, respectively (FIG. 9), and comprising the above mentioned capacitors 23, 24 and other known filter circuit elements. A second filter system is substantially formed by added corresponding filter capicitor means 57, 58 for each module (FIGS. 6 and 8), secured to the underside of the bottom plate 14 adjacent the corresponding socket 39. In this manner a very high degree of RF attenuation, substantially equalling the gain of the amplifier or other module system, can be obtained and required stability of the amplifier or other module system can be enhanced. This is achieved in part by the known expedient of using multiple filtering, which requires no further description and explanation. In other part the result is achieved by the feature that at least one system of filters, both on the input and output sides, utilizes bypass capacitors 23, 24 having one side embedded in and directly solder-connected with a large, grounded shield plane 20 (FIG. 4), thereby avoiding stray currents and stray capacitance and inductance. The other filter system, below the bottom plate 14 (FIGS. 6 and 8) may use conventional, open, wire-connected capacitors with outer protective caps 59, and may use straight sections of the lead wires 50, 51, 52 as inductors. Adequate power lead filtering can generally be obtained by such a combination of open and embedded elements, at least up to frequencies of about one hundred megacycles. At higher frequencies it becomes desirable that improved ground-connecting features, similar to the filters 55, 56 of the present modules, be used in the bottom plate combination 57, 58.

In addition to the stack of modules M1, M2 and the bottom plate filter combination 57, 58, the present amplifier comprises a special input module 60 at one end of the stack and a special output module 61 at the other end (FIGS. 1, 2, 6). These special modules are identical with those illustrated in FIG. 3, except that the input module 60 has no input coil circuit 25, 41, 55 and the output module 61 has no output coil circuit 26, 44, 56. Instead, as schematically shown in FIG. 2, the input module 60 may have an input connector 62 extending through a fitting 54 and the output module 61 may employ a detector 63 and have an output connector extending through a similar fitting 54.

The operation of the present module unit and combination is believed to be clear from the foregoing description. However it may be well briefly to recapitulate, with basic reference to FIG. 2: RF signals arrive from input module 60 in a first input coil 25; they are conducted over a path 30 of minimum length and capacity to the control grid of tube 17; they are reproduced, with suitable amplification, in the plate current of tube 17 which is then conducted to output coil 26 over a path 31 of minimum length and capacity. The coils 25, 26 of the module are effectively isolated from one another by shield 20. From the output coil 26 of the first module the RF signal passes, substantially inductively only, to the input coil of the next module; and so on in successive modular stages. The power leads receive and transmit practically no RF energy and the stacking of the series of modules, along such leads, causes no stray coupling.

As a result of these operational features it has been found possible with a stack of twenty modules according to this invention to obtain a gain of ninety-four db with an overall bandwith of thirty megacycles, at one hundred thirty megacycles center frequency.

It has further been found simple to adapt the device to the most varied types of work. For instance, the center frequency can be changed within wide limits, by merely removing the module panels 16 from the stack and installing different coils 25, 26 thereon, together with their carrier pads 27. Thereafter the panels 16 can be reinserted in the stack by unskilled labor; no precision of mechanical alignment is required. As a further example, increased degrees of mutual inductance between the coils 25, 26 can be obtained by decreasing the thickness of the dielectric films 29 and correspondingly increasing the thickness of the spacing pads 28. Again the operation is very simple.

A description of manufacturing methods for the present module, either automatic or manual, is believed to be unnecessary. However, it may be well to point out a few features of significance to the economy of the device. One such feature is that the highly effective shield 20, with the small apertures 21, 22 therein, can be produced at practically no cost, as part of that operation which produces the back portion of the printed circuit pattern. Another feature of economy and also of accuracy is that the design of module M facilitates assembly thereof with the various tubes, coils, resistors, capacitors, spacers, connector pins for the same, and other circuit elements. Known methods of dip soldering can be used, on one or both sides of the module. As a final stage, each module may be tested either automatically or mechanically as to its various electronic characteristics, such as gain, continuity of circuits, insulation, etc.

Particular attention is drawn to the simplicity of alignment testing which characterizes the present module unit and combination. The adjustable trimmer capacitors 25C and 26C are provided for this purpose. Proper alignment of the entire stacked combination is accomplished by suitable pre-alignment of each individual module, without any overall alignment operations; thereby greatly simplifying the completion of the amplifier or other module combination.

Service operations are freqeuntly required on combinations and devices of this type. Such operations are extremely simple in the present case, particularly by virtue of the features that the modules require only individual alignment so that they are interchangeable and that they are stacked on power leads only so that they can be inserted, removed and re-inserted upon mere loosening and retightening of the clamping knobs 37, 38.

Figure 12:
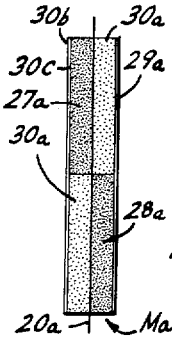
FIGS. 11 and 12 are respectively front and side views of a modified module.
Figure 11:
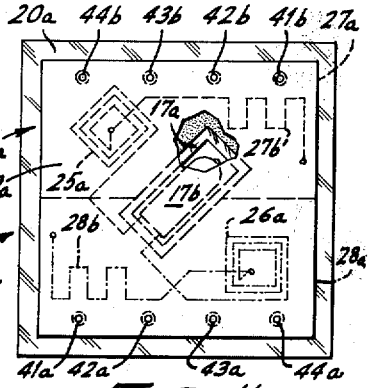

Referring finally to the modified module Ma of FIGS. 11 and 12: Instead of spacing the module panels 16 apart as in FIGS. 1 and 6, modules can be stacked in complete surface contact with one another; and their respective shields 20a can be placed in extremely close proximity to one another, which further benefits the self-shielding action and prevention of stray coupling between input and output coils 25a, 26a and between successive modular stages. In the interest of such self-shielding, it may be desirable to make the areas of the shield 20a larger than those of the mutually contacting panel members. Not only the outer margin of the module but also an inner recess 17a for the discharge device 17b may have a free margin of the shield metal extend around it. When such an arrangement is used, it is often possible to practically eliminate all undesirable stray coupling without any exterior shield such as that shown in FIG. 1.

By the described feature of FIGS. 11 and 12 the shield 20a also serves to insure adequate dissipation of heat generated within the stack of mutually contacting modules.

By means of the described construction, the stack of modules Ma can be given the form of a solid block, the outside of which may be lacquered or otherwise protected from moisture and dust; the shield 20 extending through at least one of the walls of the block other than the walls parallel with the planes of the coils 25a, 26a. Such a block construction of the stack is practical mainly in cases where little or no subsequent manipulation of individual modules is required.

The general construction and operation of each module Ma can be the same as that described above for modules M. Correspondingly numbered module and circuit elements with suffixes "a" or "b," some of which are shown in the drawing, can be arranged and operated in manners corresponding with those described for the elementary modules M.

A further modified feature is also shown in FIG. 11, according to which the power and ground leads 41a, 42a, 43a and 44a have the form of annular connectors adapted to engage riser wires. These connectors are suitably interconnected with their respective circuit elements on each module Ma by printed wiring conductors, not shown.

Desirably, added conductors of similar kind may be used to provide each module Ma with a duplicate set of power and ground lead connectors 41b, 42b, 43b, 44b, shown as an upper row of connector rings, which row extends parallel with the row 41a, 42a, etc. but forms a mirror image thereof as to the lateral sequence of connectors. This avoids the need for mirror image modules, such as those shown at M2 in FIGS. 1 and 3.

Rigid riser wires may be used for stacking up; and by suitable lateral spacing of connectors on the module—for instance by relative proximity between connectors 41a, 42a and likewise between connectors 41b, 42b as shown—a proper plan of stacking up can be enforced, wherein successive modules Ma have their respective input and output coils 25a, 26a suitably superimposed over one another and yet the need for different modules, arranged with standard printed wiring and mirror image printed wiring, is eliminated. As shown in FIG. 11, one module Ma has an input coil 25a in an upper left-hand corner in front of the respective card element 16a while having an output coil 26a in a lower right-hand corner in back of said card element 16a. The next following module Ma, constructed identically with that illustrated and disposed either in front or in back of that shown will have its input coil in the lower right-hand corner and its output coil in the upper left-hand corner. All modules can be stacked on one set of riser wires; for instance, there can be used a single input power wire, passing successively through connectors 41a, 41b.

Still another modified feature is shown in FIGS. 11 and 12: Each RF coupling coil 25a, 26a is mounted on a small panel 27a, 28a which also has mounted thereon either one or several or all of the component elements 27b, 28b of the respective tuned circuit. The remaining constituents of the network required for the complete module may be mounted either in printed form or otherwise on flat module card means, such as that shown at 29a, which may also interconnect the small panels 27a, 28a with required spacers and covers 30a, 30b. Suitable dielectric material can readily be used for the intermodular cover boards or films 29a, 30b. The latter elements may also have printed thereon, partial shield means 30c for the purpose of facilitating modifications of mutual inductive coupling without change in standardized coils and other standardized module components.

It is also possible to support various module elements on the shield 20 or 20a instead of supporting the shield and all other components by the card. It is further possible to substitute transistor combinations for the tubes shown. It will be clear to persons skilled in the art, upon a study of this disclosure, that a great variety of other changes can be made, all within the spirit of the present invention.

While only one amplifier and two types of modules according to the invention have been described, it should be understood that the details thereof are not to be construed as limitative of the invention, except insofar as set forth in the following claims.

I claim:

1. An energy transmission module, comprising: a carrier panel; flat input circuit means carried by the panel on one side thereof; flat output circuit means carried by the panel on the opposite side thereof; shield means on the panel shielding the input circuit means from the output circuit means; and signal transfer means carried by the panel, between said flat circuit means, for coupling the flat input circuit means to the flat output circuit means; said flat input circuit means being arranged for signal transfer by reactive coupling to the output circuit means of a similar module and said flat output circuit means being arranged for signal transfer by reactive coupling to the input circuit means of another similar module.

2. A module as described in claim 1, having "printed circuit" elements formed on both sides of the panel, said elements comprising at least portions of said shield means.

3. In an energy transmission system, a stack of circuit modules having surfaces in contact with one another, each module including a carrier panel, input circuitry carried by the panel and including flat circuit means directly adjacent and parallel to one of said surfaces, on one side of the panel, output circuitry carried by the panel and including flat circuit means directly adjacent and parallel to the surface, on the opposite side of the panel, shield means on the panel shielding the input circuitry of the panel from the output circuitry thereof, signal transfer means carried by the panel between said surfaces of the module, for signal transfer by coupling the input circuitry of the panel to the output circuitry thereof, said flat circuit means of input and output circuitries of successive modules being in general register with one another, in the stack so that each pair of mutually contacting panel surfaces includes output circuit means of one panel, confronting and reactively coupled with input circuit means of the adjacent panel, and means for insulating the mutually confronting, flat output and input circuit means from one another.

4. A system as described in claim 3 wherein the input and output circuit means are flat coils, the system including a plurality of insulating spacer films, interposed between mutually confronting coils.

5. A system as described in claim 4 wherein such films are secured to the respective flat coils.

6. A system as described in claim 3, additionally comprising means for compressing the stack of circuit modules, axially of said stack.

7. A system as described in claim 3 wherein each carrier panel comprises a flat insulating board and wherein the shield means and at least a majority of the transfer means are secured directly to the board, whereas the input and output means are secured to but slightly spaced from and extending parallel to the board.

8. Apparatus as described in claim 7 wherein the signal transfer means also include capacitors disposed in planes transverse of the board, said capacitors being embedded in the board and in the shield means thereon and being secured to the shield means by direct soldering of one conductive coating of such capacitors.

9. An energy transmission system comprising a stack of mutually contacting circuit modules, each module comprising a carrier; at least certain of the modules comprising input circut means for each of said modules, lying in a plane transverse of the stack and secured to the respective carrier on one side thereof, and output circut means for the respective module, lying in a similar plane and secured to the respective carrier on the other side thereof, said input and output circuit means of the system being in cascaded, reactively coupled arrangement; at least certain of the modules also comprising shield means secured to the respective carrier so as to isolate the input circuit means of the respective module from the output circuit means thereof; means secured to each carrier for completing an electronic signal translating circuit with the input and output circuit means; and means for applying power to said circuit means.

10. A system as described in claim 9, wherein the input and output circuit means are substantially square spiralled coils lying in planes parallel to the respective carrier boards.

11. A system as described in claim 10 wherein the input and output coils have corresponding sides extending in directions crossing one another.

12. A system as described in claim 9 additionally comprising stack compressor means for normally holding the circuit modules together, said compressor means being adapted to allow removal and reinsertion of circuit modules forming part of the stack.

*13. An electrical apparatus, said apparatus comprising: an envelope having first and second parallel sides; a source of an input signal; an electrical unit positioned in said envelope and responsive to the application of said input signal for generating an output signal; first reactive coupling means including first and second separable components for applying said input signal to said electrical unit when said first and second separable components are in proximity to each other, said first separable component being positioned in said envelope and coupled to said electrical unit and said second separable component being positioned outside said envelope and being coupled to said source of said input signal; second reactive coupling means including third and fourth separable components for regenerating said output signal at said fourth separable component when said third and fourth separable components are in proximity to one another, said third separable component being positioned in said envelope and coupled to said electrical unit and said fourth separable component being positioned outside said envelope; and positioning means for positioning said second separable component, said fourth separable component and said envelope so that said first and second separable components and said third and fourth separable components are in proximity of one another, respectively.*

References Cited in the file of this patent or the original patent

UNITED STATES PATENTS

| | | |
|---|---|---|
| 1,502,063 | Schottky | July 22, 1924 |
| 2,066,876 | Carpenter et al. | Jan. 5, 1937 |
| 2,474,988 | Sargrove | July 5, 1949 |
| 2,512,138 | Butt | June 20, 1950 |
| 2,560,320 | Winkler | July 10, 1951 |
| 2,579,141 | Eckert et al. | Dec. 18, 1951 |
| 2,586,854 | Myers | Feb. 26, 1952 |
| 2,647,957 | Mallinckrodt | Aug. 4, 1953 |
| 2,701,346 | Powell | Feb. 1, 1955 |
| 2,718,623 | Yoder et al. | Sept. 20, 1955 |
| 2,748,321 | Kamm | May 29, 1956 |